(12) United States Patent
Mess et al.

(10) Patent No.: US 7,704,794 B2
(45) Date of Patent: Apr. 27, 2010

(54) METHOD OF FORMING A SEMICONDUCTOR DEVICE

(75) Inventors: Leonard E. Mess, Boise, ID (US); Jerry M. Brooks, Caldwell, ID (US); David J. Corisis, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/599,223

(22) Filed: Nov. 13, 2006

(65) Prior Publication Data

US 2007/0065987 A1 Mar. 22, 2007

Related U.S. Application Data

(60) Division of application No. 10/933,059, filed on Sep. 1, 2004, which is a continuation of application No. 09/886,593, filed on Jun. 21, 2001, now Pat. No. 6,900,528.

(51) Int. Cl.
*H01L 21/00* (2006.01)
(52) U.S. Cl. ............... 438/112; 438/108; 438/109; 257/E21.705; 257/E25.013
(58) Field of Classification Search ............... 438/108, 438/109, 112, 118, 127
See application file for complete search history.

(56) References Cited

U.S. PATENT DOCUMENTS

| | | | |
|---|---|---|---|
| 5,012,323 A | 4/1991 | Farnworth | |
| 5,128,831 A | 7/1992 | Fox, III et al. | |
| 5,147,815 A | 9/1992 | Casto | |
| 5,291,061 A | 3/1994 | Ball | |
| 5,323,060 A | 6/1994 | Fogal et al. | |
| 5,399,898 A | 3/1995 | Rostoker | |
| 5,422,435 A | 6/1995 | Takiar et al. | |
| 5,434,745 A | 7/1995 | Shokrgozar et al. | |
| 5,478,781 A | 12/1995 | Bertin et al. | |
| 5,483,024 A | 1/1996 | Russell et al. | |
| 5,530,287 A | 6/1996 | Currie et al. | |
| 5,585,668 A | 12/1996 | Burns | |
| 5,585,675 A | 12/1996 | Knopf | |
| 5,635,010 A | 6/1997 | Pepe et al. | |
| 5,689,135 A | 11/1997 | Ball | |
| 5,723,906 A | 3/1998 | Rush | |
| 5,793,108 A * | 8/1998 | Nakanishi et al. ........... 257/723 |
| 5,807,762 A | 9/1998 | Akram et al. | |

(Continued)

FOREIGN PATENT DOCUMENTS

JP 56-158467 12/1981

(Continued)

*Primary Examiner*—Fernando L Toledo
(74) *Attorney, Agent, or Firm*—TraskBritt

(57) ABSTRACT

A semiconductor device is formed of two or more dice of similar dimensions and bond pad arrangement, in which bond pads are located in fields along less than three edges of the active surface of each die. A first die is attached to a substrate and subsequent die or dice are attached in a vertical sequence atop the first die, each in an offset configuration from the next lower die to expose the bond pads thereof for conductive bonding to metallization of the substrate. The multiple chip device permits a plurality of dice to be stacked in a maximum density low profile device. A particularly useful application is the formation of stacked mass storage flash memory package.

54 Claims, 13 Drawing Sheets

U.S. PATENT DOCUMENTS

| | | |
|---|---|---|
| 5,899,705 A | 5/1999 | Akram |
| 5,952,725 A | 9/1999 | Ball |
| 5,963,794 A | 10/1999 | Fogal et al. |
| 5,973,403 A | 10/1999 | Wark |
| 5,998,864 A * | 12/1999 | Khandros et al. ........... 257/723 |
| 6,051,878 A | 4/2000 | Akram et al. |
| 6,051,886 A | 4/2000 | Fogal et al. |
| 6,359,340 B1 | 3/2002 | Lin et al. |
| 6,376,904 B1 | 4/2002 | Haba et al. |
| 6,376,914 B2 | 4/2002 | Kovats et al. |
| 6,461,897 B2 | 10/2002 | Lin et al. |
| 6,552,423 B2 | 4/2003 | Song et al. |
| 6,580,035 B1 | 6/2003 | Chung |
| 6,621,155 B1 | 9/2003 | Perino et al. |
| 6,784,019 B2 | 8/2004 | Huang |
| 6,900,528 B2 | 5/2005 | Mess et al. |
| 2003/0137042 A1 | 7/2003 | Mess et al. |

FOREIGN PATENT DOCUMENTS

| | | |
|---|---|---|
| JP | 62-8534 | 1/1987 |
| JP | 63-104343 | 5/1988 |
| JP | 3-165550 | 7/1991 |
| JP | 5-13665 | 1/1993 |

* cited by examiner

METHOD OF FORMING A SEMICONDUCTOR DEVICE

CROSS-REFERENCE TO RELATED APPLICATIONS

This application is a divisional of application Ser. No. 10/933,059, filed Sep. 1, 2004, now U.S. Pat. No. 7,375,419, issued May 20, 2008, which is a continuation of application Ser. No. 09/886,593, filed Jun. 21, 2001, now U.S. Pat. No. 6,900,528, issued May 31, 2005.

BACKGROUND OF THE INVENTION

1. Field of the Invention

This invention relates generally to packaged semiconductor devices. More particularly, the invention pertains to flash memory devices having high memory density.

2. State of the Art

The use of semiconductor integrated circuit (IC) chips is widespread, in both commercial grade and specific high reliability applications. Continuing progress in the manufacture of IC chips has resulted in chips of greatly increased density, i.e., higher number of devices per footprint area of each chip. In addition, to produce increasingly complex electronic components, it is necessary to include a much greater number of IC chips on a substrate, e.g., a circuit board. One solution to this dilemma is to form a stack of chips on a substrate, creating what is known in the art as a multi-chip package.

The state of the art in vertically stacked multi-chip module (MCM) devices is illustrated by representative prior art devices shown in drawing FIGS. 1 through 11.

A representative example of a known multi-chip module semiconductor device 10, prior to packaging, is shown in drawing FIG. 1.

A plurality of chips or dice 12A, 12B and 12C (identified as dice 12) are mounted in a pyramidal stack on a substrate 14. Each die is mounted with an adhesive material 16 to the next lower die or substrate and is electrically connected to the substrate 14 by bond wires 18 using known wire bonding methods. Variants of this multi-chip configuration are described in U.S. Pat. No. 5,422,435 to Takiar et al., Japan Patent 62-8534(A) to Tsukahara and Japan Patent 3-165550 (A) to Yashiro. In each of these references, a pyramidal stack is formed of increasingly smaller chips or dice 12, in order to accommodate the placement of bond wires 18 on peripheral portions of each die 12. This configuration is not generally useful where dice of equal dimensions are to be placed in a multi-chip module (MCM), such as in a memory device.

In drawing FIG. 2, a pyramidal stack of chips in device 10 is shown as described in U.S. Pat. No. 5,399,898 to Rostoker. In these references, the dice 12A, 12B, 12C comprise "flip-chips" with solder bumps or balls 20 joined to conductive areas on the back side 22 of the underlying flip-chip.

Depicted in drawing FIG. 3 is an MCM device 10 in which a first die 12A is attached to a substrate 14 with adhesive material 16 and is electrically connected to the substrate 14 with bond wires 18. A second die 12B is stacked atop the first die 12A and connected to it by solder balls 20. The second die 12B is smaller than the first die 12A, in order to leave access to the first die's 12A conductive areas. This type of arrangement is depicted in Japan Patent 56-158467(A) to Tsubouchi, and a variant thereof is described in Japan Patent 63-104343 to Kuranaga.

Depicted in drawing FIG. 4 is an MCM device 10 formed of dice 12A and 12D mounted on opposite surfaces of a substrate 14. In this example, the substrate 14 is a lead frame, and the construction permits both of the dice 12A, 12D to be connected to a metallization on one surface of the lead frame. This construction is described in U.S. Pat. No. 5,012,323 to Farnworth.

Each of the above stacking configurations requires that the dice be of differing sizes. This is mandated by the need to leave the bond pads of each die unobstructed for wire attachment.

There have been various configurations of MCM devices in which chips of equal dimensions are stacked. Several such configurations are shown in drawing FIGS. 5, 6, 7, 8, 9, 10 and 11 and described below.

In one MCM device configuration shown in U.S. Pat. No. 5,973,403 to Wark and Japan Patent 5-13665(A) to Yamauchi, a flip-chip die 12A is electrically bonded to a substrate 14 by posts, solder bumps or balls 20 or other connectors, and a second chip, i.e., die 12B, is attached back-to-back to the flip-chip die 12A (with an intervening insulation layer 24) and connected by bond wires 18 to the substrate 14. This particular MCM device 10 is illustrated in drawing FIG. 5.

In another form depicted in drawing FIG. 6, two dice 12A, 12B are mounted on opposite sides of a substrate 14, with intervening insulation layers 24. The dice 12A, 12B are shown with bond wires 18. This general dice-to-substrate configuration with variants is pictured in U.S. Pat. No. 5,147,815 to Casto, U.S. Pat. No. 5,689,135 to Ball, and U.S. Pat. No. 5,899,705 to Akram.

An MCM device 10 that combines various die configurations already described above in drawing FIGS. 1 through 6 is shown in U.S. Pat. No. 6,051,878 to Akram et al. The apparatus uses conductive column-like structures to connect substrates that carry the dice.

As shown in drawing FIG. 7, an MCM device 10 described in U.S. Pat. No. 5,483,024 to Russell et al. has two identical dice 12A, 12B with central bond pads. The dice are sandwiched between and attached to two lead frames 14A, 14B with discontinuous adhesive layers 16A and 16B. The dice 12A, 12B are joined by an intervening insulation layer 24. Bond wires 18 connect each die to the corresponding lead frame.

In drawing FIG. 8, a stacked MCM device 10 is depicted in accordance with the disclosure of U.S. Pat. No. 5,323,060 to Fogal et al. In this device, dice 12A, 12B, 12C, and 12D are vertically alternated with adhesive layers 16A, 16B and 16C. The thickness of the adhesive layers is enhanced to be greater than the bond wire loop height, so that bond wires 18 may be attached to the active surfaces of the dice, for connection to the substrate 14.

Described in U.S. Pat. No. 5,291,061 to Ball is a similar stacked device 10 in which the thickness of the adhesive layers 16A, 16B and 16C is reduced, using a low-loop-profile wire-bonding operation.

As shown in drawing FIG. 9, a device configuration generally shown in U.S. Pat. No. 5,399,898 to Rostoker uses an upper flip-chip die 12E to join dice 12A mounted on a substrate 14. The dice 12A are connected to substrate metallization with bond wires 18. Thus, the device 10 comprises three dice connected serially.

There are various forms of an MCM device in which separate enclosed units are first formed and then stacked. Examples are described in U.S. Pat. No. 5,434,745 to Shokrgozar et al. and U.S. Pat. No. 5,128,831 to Fox, m et al. A typical stacked device 10 of this construction is depicted in drawing FIG. 10, showing three units. Each unit comprises an intermediate substrate 15A with a metalized surface. A die 12A, 12B or 12C is mounted on the intermediate substrate 15A and connected to the metallization 30 by bond wires 18.

A wall 32 surrounding each die 12 encloses the die 12, bond wires 18, and metallization 30. The various metallization leads extend to conductive columns 34 within the wall 32, the latter connected to metallization 40 on substrate 14. An insulative cover 38 protects the upper unit and forms a protective shell about the device.

In another design of MCM package device 10 shown in drawing FIG. 11, a plurality of dice 12A, 12B, . . . have beveled edges 28 that permit the bonding of wires to edge bond pads on the active surfaces 26. This design requires that the die thickness 36 be sufficiently great to accommodate wire loop height in the beveled regions. If the die thickness 36 is insufficient, the thickness of adhesive material 16 must be increased. Thus, the device height will be increased. Also, the beveled edges 28 are weak and subject to breakage.

In each of the above prior art configurations for forming MCM devices containing a stack of identically configured dice, various limitations and/or problems exist as indicated above. A new device design is needed in which a plurality of identical dice with bond pads along one edge or two edges may be readily stacked for parallel operation. The new design must provide a device requiring fewer manufacturing steps and providing high density with enhanced reliability.

BRIEF SUMMARY OF THE INVENTION

In accordance with the invention, a semiconductor device is formed of two or more chips, i.e., dice, in which bond pads are located in areas along one or two edges of the active surface of each die. The device of the invention is particularly useful when configured to be formed of a stack of semiconductor dice that are substantially the same or similar in shape, size and bond pad arrangement, although not necessarily of identical shape, size and bond pad arrangement. An example of this die configuration is a mass memory storage device with a row or rows of bond pads along one edge of the semiconductor die.

In a device of this embodiment, the dice are arranged in a stack in which each individual semiconductor die is positionally offset from the next lower semiconductor die, thus exposing the bond pads of each die for wire bonding or other conductor attachment. In some embodiments, a semiconductor die may overhang bond pads of an underlying semiconductor die, but the thickness of an intervening offset semiconductor die supporting the overhanging semiconductor die, together with two thin adhesive layers, provides sufficient "headroom" to accommodate the wire loop height. The thickness (Z-dimension) of adhesive layers may be minimized to reduce overall device height. Where bond pads are overhung by another die, wire bonding is successfully accomplished without the use of thick adhesive layers.

A substrate may be any body that supports the device, including, for example, a circuit board, a circuit card such as a multiple memory card, a lead frame or a tape automated bonding (TAB) tape. The bond pads of each die are exposed for rapid precise bond wiring to the substrate. In one embodiment, the apparatus is formed as a single stack of dice connected to a substrate whose reverse surface is configured for solder-ball bonding to another metalized surface.

In this embodiment, semiconductor dice having bond pads along one edge only need not be offset from each other in more than one direction. Semiconductor dice configured with bond pads along two adjacent edges are always offset from each other along two axes, i.e., in two directions. The offset exposes bond pads of a lower die to permit convenient wire bonding between each chip and a substrate.

Where the stack comprises more than two semiconductor dice, the offset of each semiconductor die may be positive or negative along both axes. The stack may include a reversal in the direction of offset. In this case, the die underlying the die having an offset direction change must also be rotated in orientation about a central Z-axis. The active surface of the semiconductor die may be rotated to place the bond pads adjacent a different location of the substrate. Such rotation may comprise zero, 90, 180 or 270 degrees in a clockwise or counter-clockwise direction.

Packaging of the device may use conventional processes for enclosing the semiconductor dice and conductors in a plastic, metal or ceramic encapsulant.

Some embodiments of the invention having up to four or more semiconductor dice provide complete exposure of all bond pads.

Use of this design provides adequate space for wire-bonding the bond pads that underlie die edges of a higher semiconductor die, because the spacer consists not of a thick adhesive layer, but an intervening die or a piece of silicon or similar material substantially the same size as the semiconductor die. In some instances, inoperative semiconductor dice may be used in the stack between operative semiconductor dice located on either side thereof. The designs of the stack and the substrate are coordinated to provide an easily formed device that may, for example, have a high memory density, minimal height, short bond wires, small footprint, and high speed and responsiveness. In one embodiment, the package is particularly useful as a high speed multi-die mass storage flash memory device with a high memory density.

BRIEF DESCRIPTION OF THE SEVERAL VIEWS OF THE DRAWINGS

FIGS. 17 through 24 are simplified side views of various exemplary embodiments of unencapsulated stacked multiple die devices having different configurations of one-axis die stacking and wire bonding, in which:

FIG. 17 is a side view of an offset stacked multiple die device having forwardly offset dice connected to a substrate, in accordance with the invention;

FIG. 18 is a side view of another embodiment of an offset stacked multiple die device having forwardly offset dice connected to a substrate, in accordance with the invention;

FIG. 19 is a side view of an offset stacked multiple die device having one rearwardly offset die and two forwardly offset dice connected to a substrate, in accordance with the invention;

FIG. 20 is a side view of another embodiment of an offset stacked multiple die device having one rearwardly offset die and two forwardly offset dice connected to a substrate, in accordance with the invention;

FIG. 21 is a side view of an offset stacked multiple die device having two rearwardly offset dice and one forwardly offset die connected to a substrate, in accordance with the invention;

FIG. 22 is a side view of another embodiment of an offset stacked multiple die device having two rearwardly offset dice and one forwardly offset die connected to a substrate, in accordance with the invention;

FIG. 23 is a side view of an offset stacked multiple die device having four dice with alternating forward and rearward offset, connected to a substrate, in accordance with the invention;

FIG. 24 is a side view of another embodiment of an offset stacked multiple die device having four dice with alternating forward and rearward offset, connected to a substrate, in accordance with the invention;

DETAILED DESCRIPTION OF THE INVENTION

Figure 1:
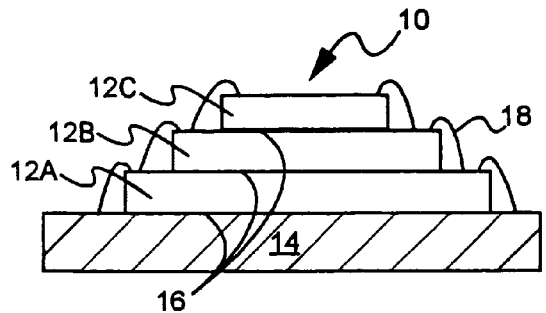
FIGS. 1 through 11 are side views of various prior art configurations of multi-chip module (MCM) devices.
Figure 3:
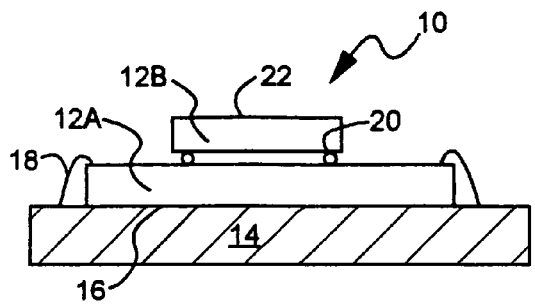
Figure 2:
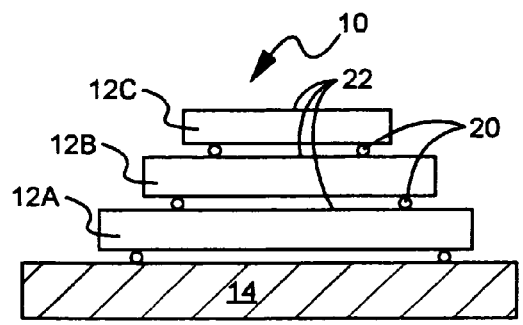
Figure 4:
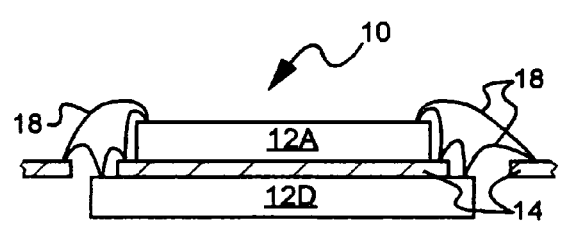
Figure 5:
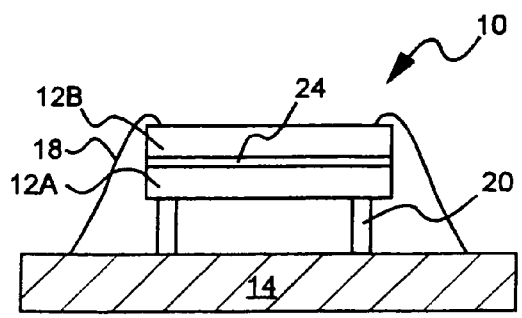
Figure 6:
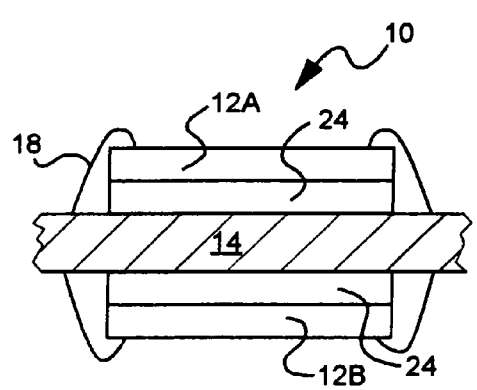
Figure 7:
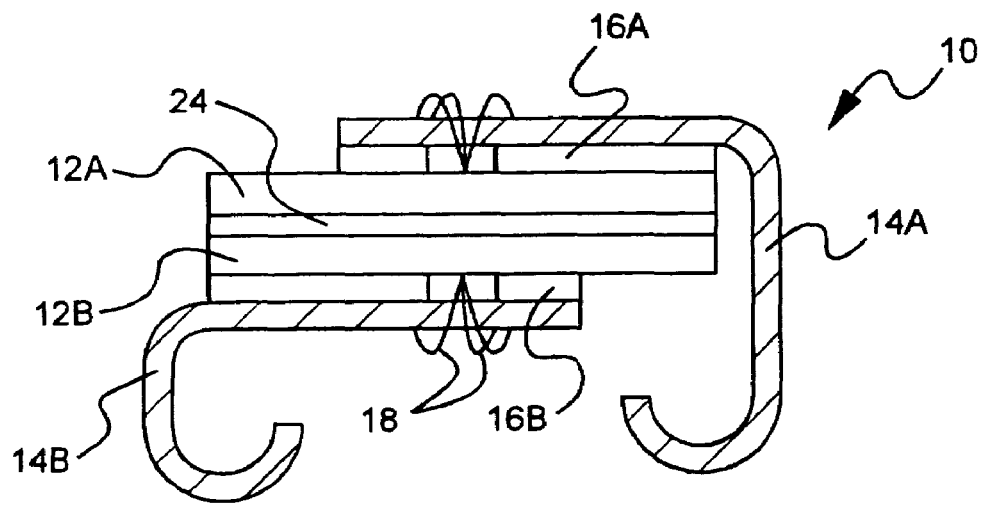
Figure 8:
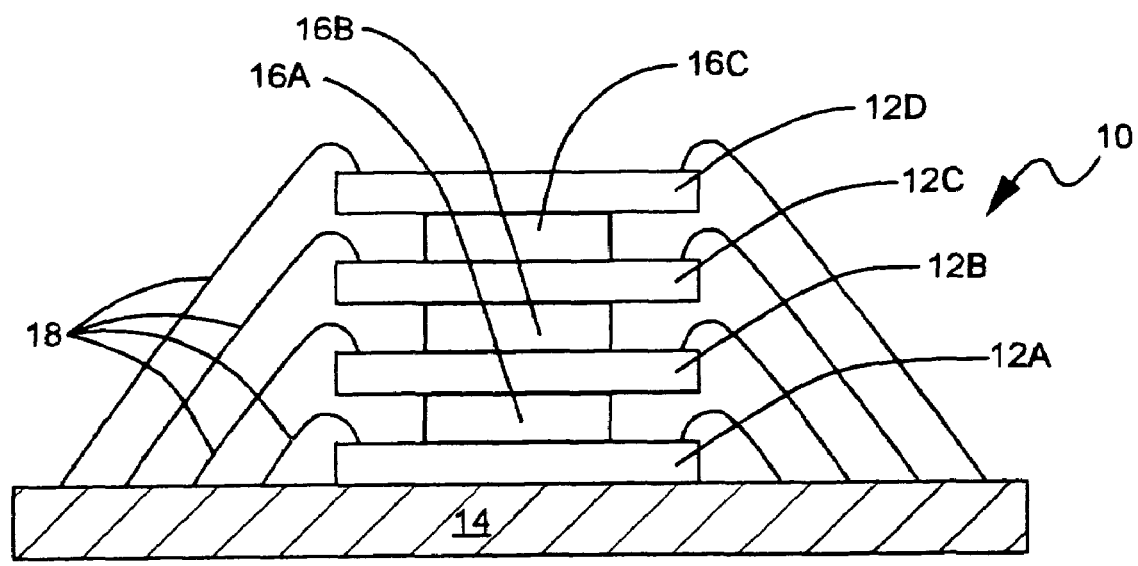
Figure 9:
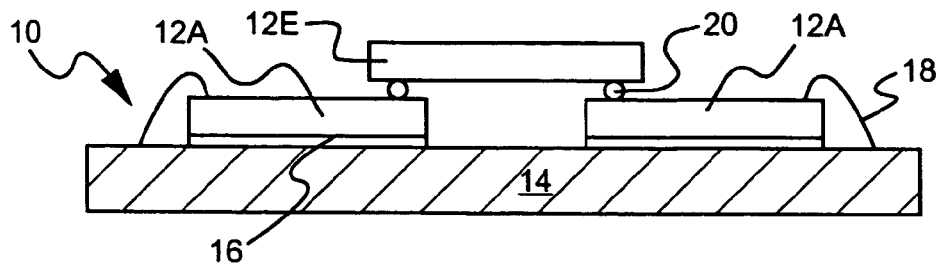
Figure 10:
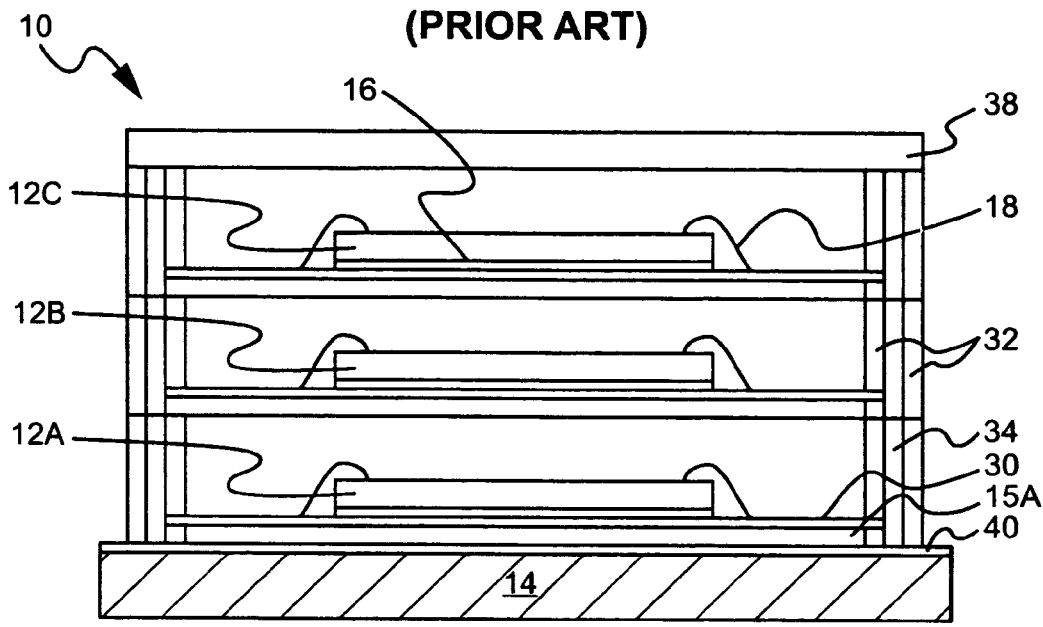
Figure 11:
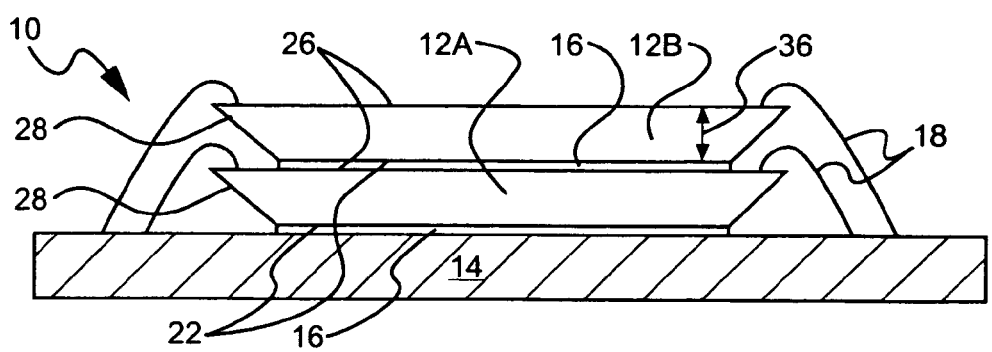

A new stacked multiple chip device formed of a plurality of offset Z-stacked, i.e., vertically stacked semiconductor dice, together with a method of production thereof are provided by the invention. Some devices of the invention may be classified as stacked multi-chip modules (MCM). Semiconductor dice that are particularly usefully stacked in this construction are those having conductive bond pads along one edge, or alternatively along two adjacent edges of the active surface. In addition, a particular embodiment will be described that utilizes elongated, i.e., semiconductor dice having bond pads along opposing distal edges of a nonsquare elongated active surface. Although the device is particularly adapted to dice of the same surface dimensions and similar bond pad layout, a stack of dice may be formed in accordance with this invention that includes one or more semiconductor dice of a differing configuration at either end of the stack, or interposed therein. The stack of semiconductor dice is physically attached to a substrate, in which the substrate may comprise, for example, a printed circuit board (PCB), a memory card, a lead frame, tape automated bonding (TAB) tape or other substrate. Additionally, similar shaped dummy dice of silicon and the like may be used as spacers between semiconductor dice in the stack.

In the figures and this description, semiconductor dice and any spacers in general will be denoted by the numeral 60, and a letter suffix i.e., A, B, C, etc. will be used to identify a particular semiconductor die or spacer or the like of a stack. Numerals identifying bond pads, bond wires, etc., that relate to a particular semiconductor die will carry the same suffix.

In this description, bond wires will be described as being connected between a semiconductor die and a substrate. It is to be understood that the wires are bonded to bond pads on the semiconductor die and to conductive members such as metallization or a lead frame, which may constitute all or part of the substrate. The device may also include semiconductor die-to-semiconductor die bonds.

With reference to the drawings of drawing FIGS. 12-12C, 13 and 14, which describe an embodiment of the instant invention, a semiconductor device 50 having a multi-chip module (MCM) type of configuration comprises two semiconductor dice 60A and 60B as a stack 61. This configuration is particularly appropriate to flash memory packages in which the die circuits are connected in parallel. In this configuration, the semiconductor dice 60A, 60B have essentially identical circuits and have upwardly facing active surfaces 52A, 52B with bond pads 54A, 54B along one edge 56A, 56B of each active surface, respectively. The bond pads of each semiconductor die 60 are collectively designated as a "field" 55 of bond pads. Each semiconductor die 60A, 60B has a length dimension 104 and a width dimension 106 that may be equal or unequal thereby making the semiconductor die 60A, 60B have different physical sizes and shapes.

Semiconductor die 60A is shown attached to a substrate 70 by adhesive layer 78. The adhesive layer 78 may be any adhesive capable of bonding a reverse surface 72 of a semiconductor die 60 to the active surface 52 of another semiconductor die or to a top side 66 of a substrate 70. Semiconductor die 60B is stacked on top of semiconductor die 60A and joined to it by thin adhesive layer 78. Semiconductor die 60B is offset from semiconductor die 60A along Y-axis 76 a distance 82, which exposes the field 55 of bond pads 54A. The offset distance 82 may be the shortest distance that permits reliable use of a wire bonding tool, not shown, to bond conductors such as bond wires 62 to the bond pads 54A. Thus, bond pads 54A, 54B are joined by fine metal bond wires 62 or other conductive members to conductive, e.g., metallization areas 58 on the top side 66 of substrate 70. If so dictated by the design of the device 50, certain bond pads 54A and 54B may also be conductively connected to each other, i.e., on the same semiconductor die 60A or 60B, or from semiconductor die 60A to semiconductor die 60B.

In these figures, the substrate 70 is pictured as a circuit board or memory card substrate or multimedia card substrate, for example. This example is shown with solder balls 64 on its reverse side 68 although other configurations of electrical connections may be used.

A controlled thickness thermoplastic or other type of adhesive may be used in adhesive layers 78 to join the semiconductor dice 60A and 60B to each other, and semiconductor die 60A to the substrate 70.

The bond pads 54A and 54B of semiconductor dice 60A and 60B, respectively, are joined to metallization or other conductive areas 58 on the substrate 70 by thin bond wires 62. Typically, the bond wires 62 have a diameter of about 0.001 inch and are formed of a metal such as aluminum or gold, or alloys thereof. The preferred method of bonding the bond wires 62 to the bond pads is known as ultrasonic ball bonding, which forms a low-loop wire bond that is less than the Z-dimension of a semiconductor die 60. Likewise, in a preferred method, ultrasonic "wedge" bonds of wire are formed at the substrate metallization area 58.

In general, semiconductor devices are encapsulated in a protective package to protect the die surfaces, metallization and wires from damage. As depicted in drawing FIGS. 12 through 14, edges of an exemplary equiangular encapsulating enclosure are defined by dashed lines 84. The encapsulant material may be a polymer, ceramic or other protective material. As shown, the completed, i.e., packaged device 50 may be formed to have a low profile vertical (Z) dimension 86 (excluding solder balls 64) that is less than prior stacked device heights, because thick intervening layers of adhesive are not required between adjacent semiconductor dice 60.

Figure 12:
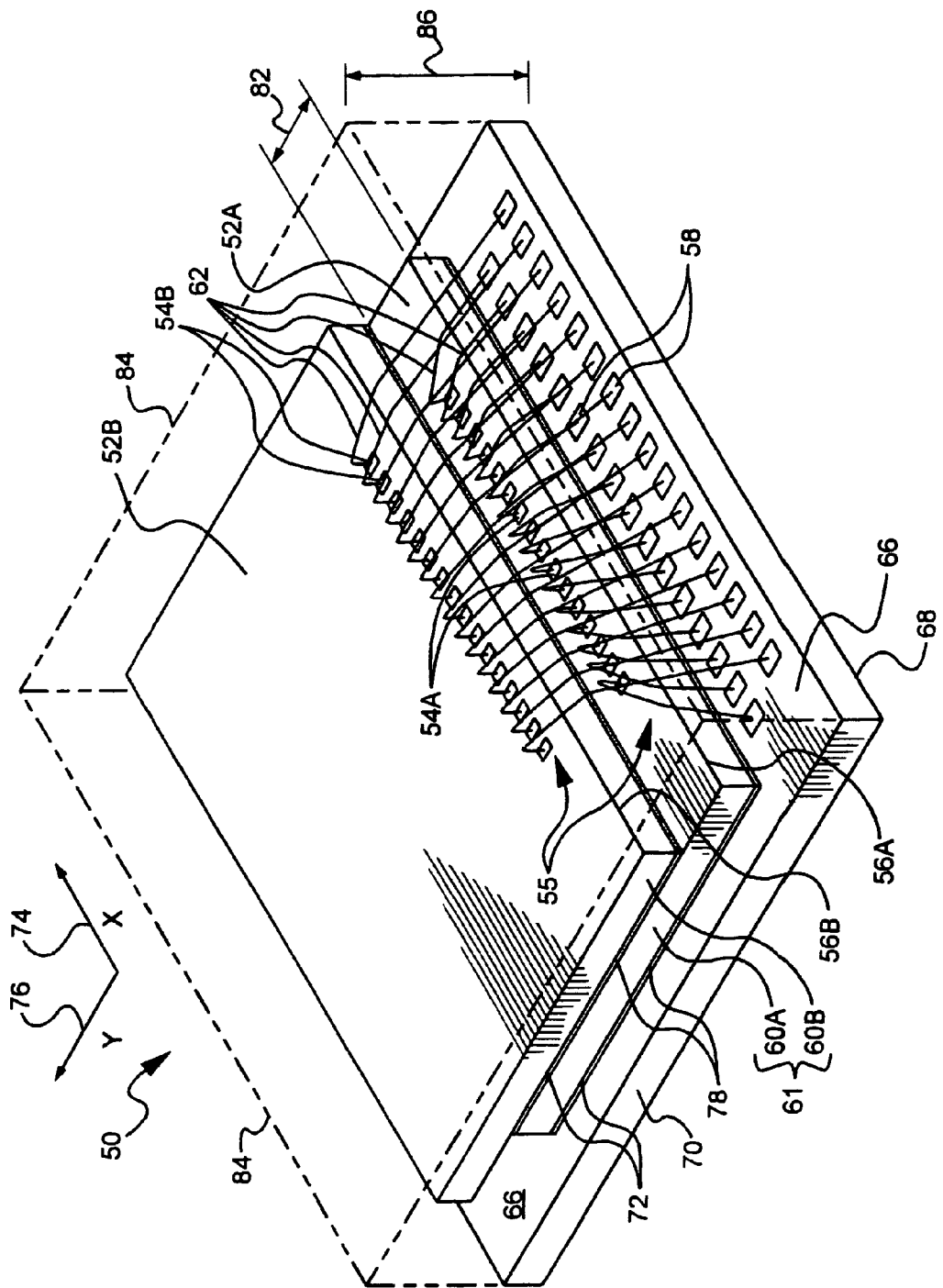
FIG. 12 is an isometric view of an offset stacked multiple die device with a single offset in accordance with the invention.
Figure 12A:
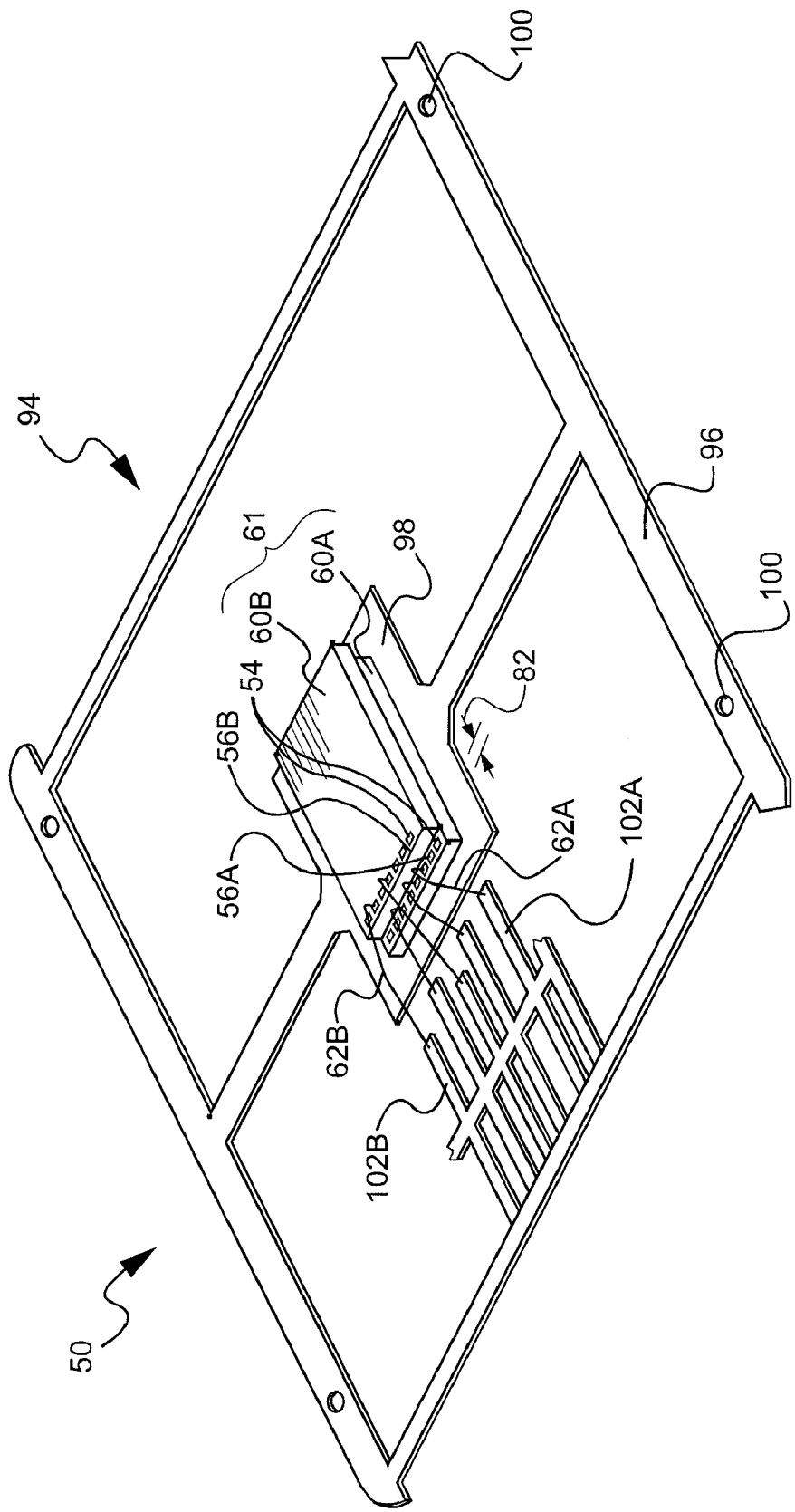
FIG. 12A is an isometric view of an offset stacked multiple die device with a single offset, mounted on a lead frame, in accordance with the invention.
Figure 12B:
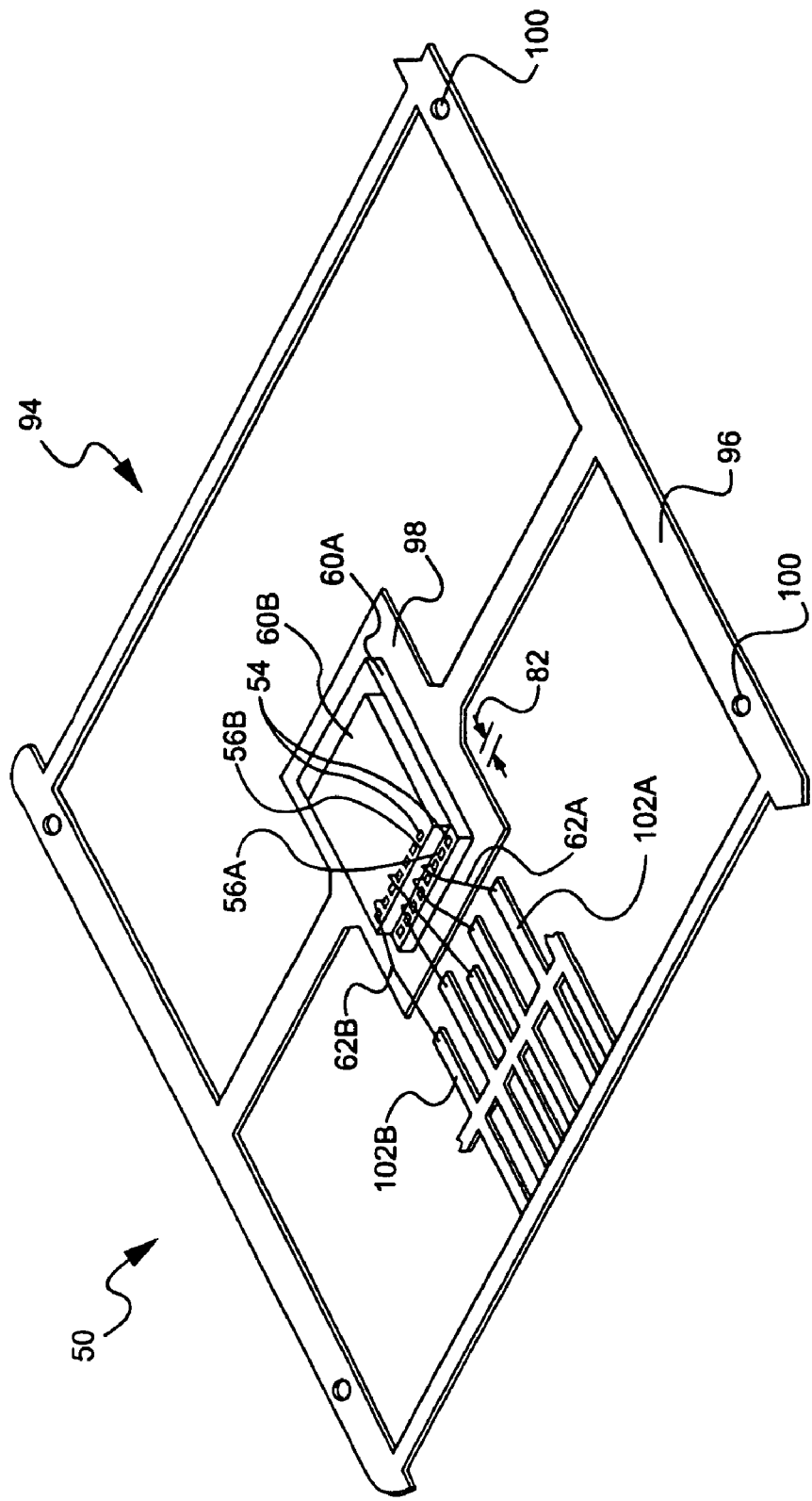
FIG. 12B is an isometric view of an offset stacked multiple die device with a single offset die of smaller size, mounted on a lead frame, in accordance with the invention.
Figure 12C:
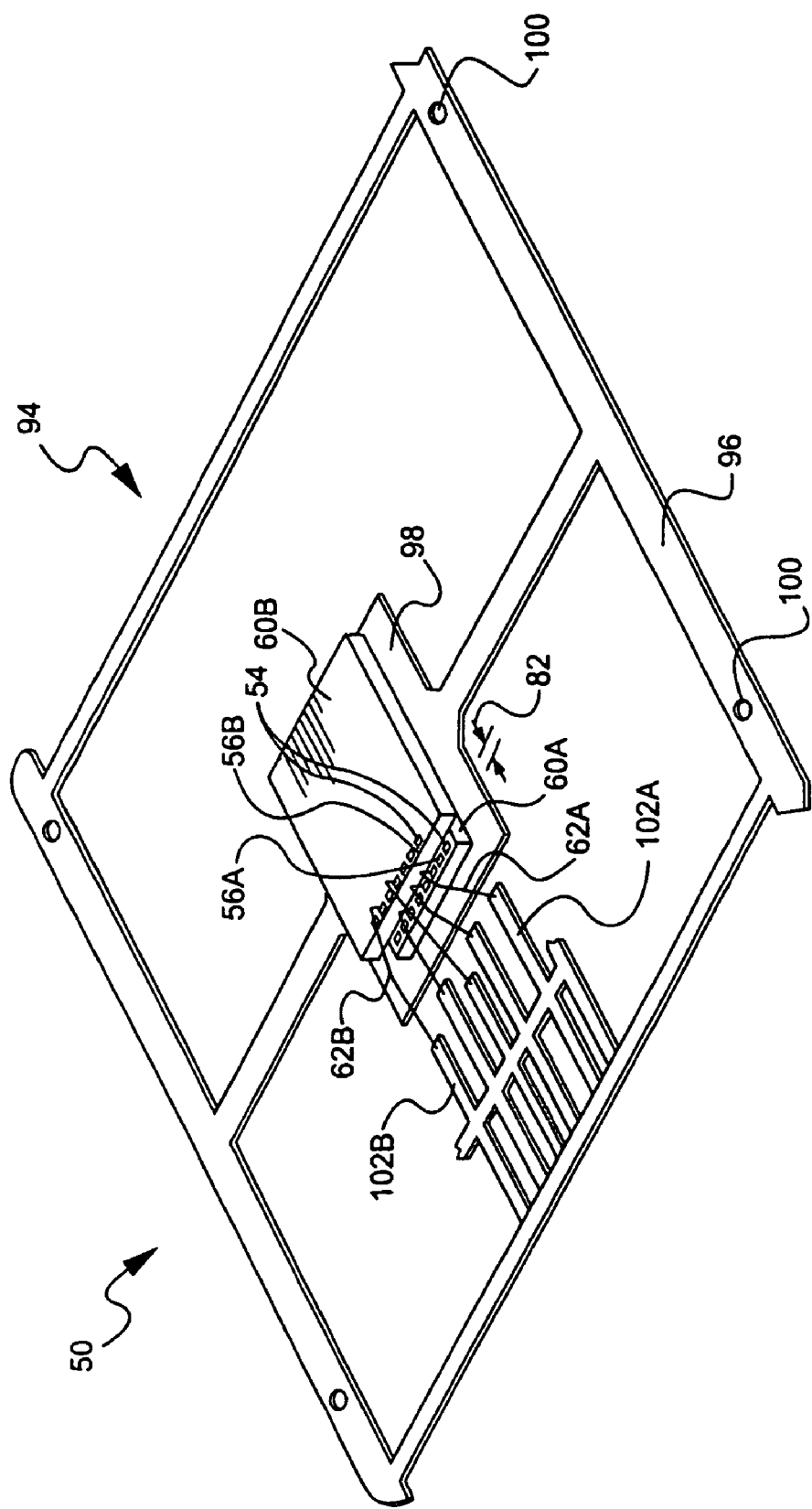
FIG. 12C is an isometric view of an offset stacked multiple die device with a single offset die of larger size, mounted on a lead frame, in accordance with the invention.

A stack 61 of two or more offset semiconductor dice 60 may also be formed on a lead frame 94, as depicted in an example in drawing FIG. 12A. The lead frame 94 is typically formed from a material such as copper, copper alloys, iron-nickel alloys, or the like. Other materials, such as TAB tape, could be used in accordance with this invention as well. The lead frame 94 is shown with opposing runners 96, a central paddle 98, and leads 102A and 102B to which wires are attached. The lead frame 94 has alignment mechanisms 100 such as precisely positioned marks or holes, for precise positioning of the lead frame 94 during operations such as die bonding and wire bonding where alignment is critical. In this example, semiconductor die 60A is attached to a paddle 98 of lead frame 94 with a thin adhesive layer, not shown. The paddle 98 serves as a substrate to support the stack 61. Semiconductor die 60B is then attached to overlie a major portion of semiconductor die 60A, wherein the die edge 56B along which bond pads 54 are positioned is offset a distance 82 from the die edge 56A of the lower semiconductor die 60A, to expose the bond pads 54. As shown, conductive bond wires 62A are connected from bond pads 54 of semiconductor die 60A to appropriate leads 102A. Likewise, bond wires 62B are connected from bond pads 54 to leads 102B. Alternatively, TAB bonding or other bonding methods may be used. As illustrated in drawing FIG. 12B, the semiconductor die 60B is of smaller size than that of semiconductor die 60A. Further, as illustrated in drawing FIG. 12C, the semiconductor die 60B is of larger size than semiconductor die 60A having three sides of the semiconductor die 60B overhanging the semiconductor die 60A.

Figure 13:
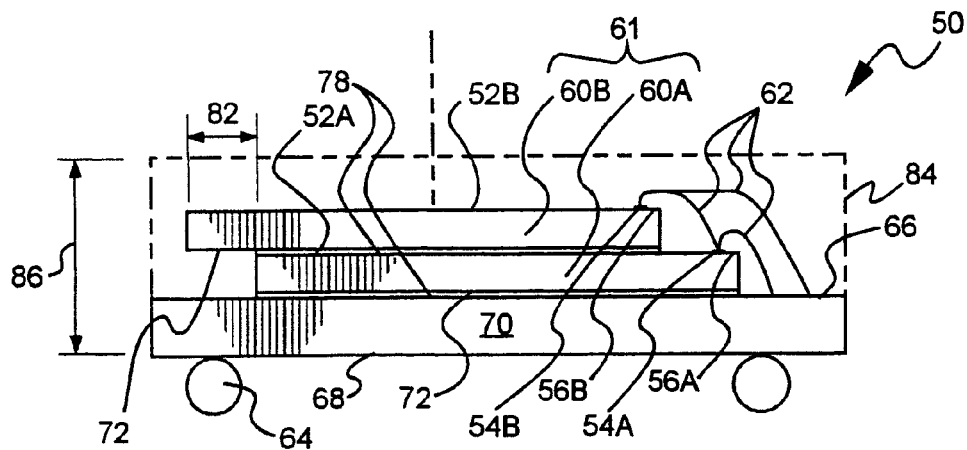
FIG. 13 is a side view of an offset stacked multiple die device with a single offset in accordance with the invention.
Figure 14:
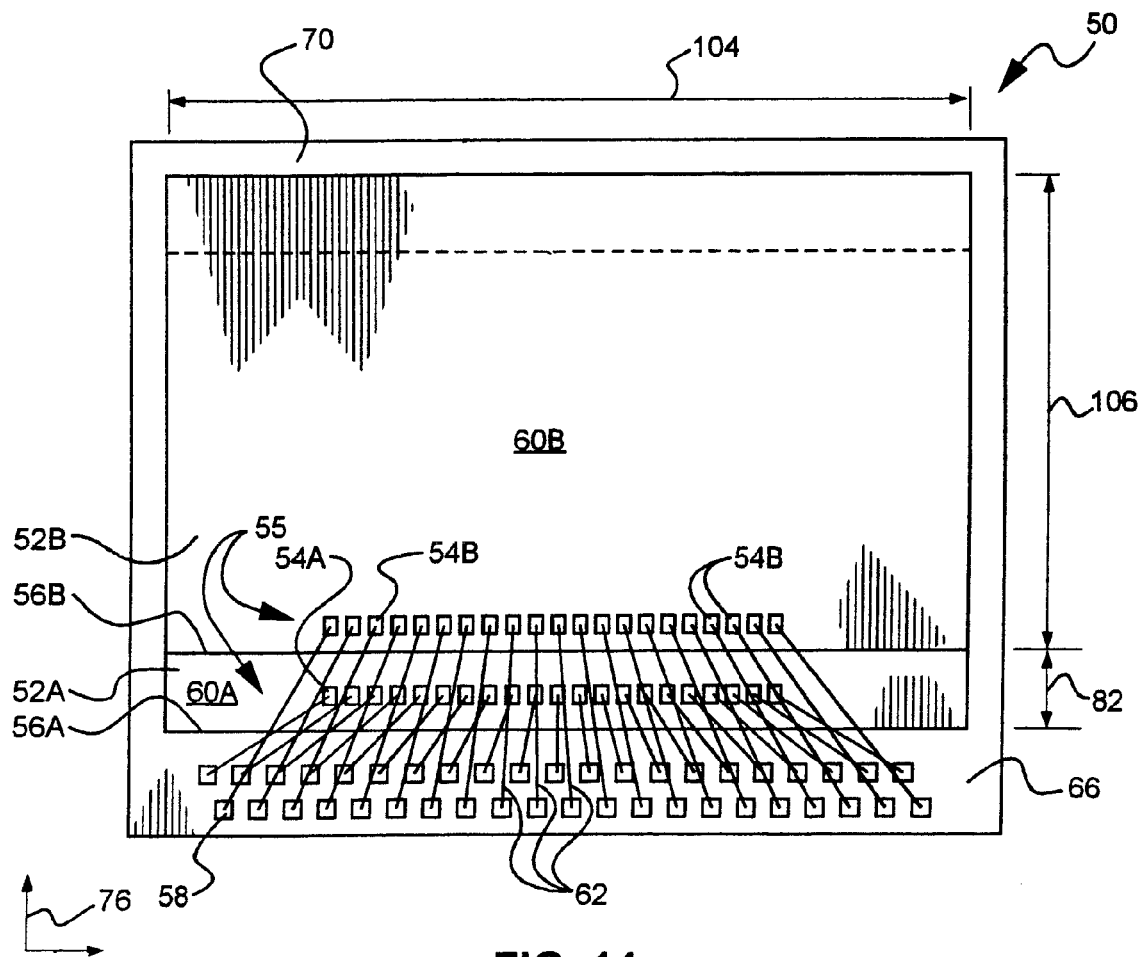
FIG. 14 is a plan view of an offset stacked multiple die device with a single offset in accordance with the invention.

In the embodiment of drawing FIGS. 12 through 14, both of the semiconductor dice 60A, 60B have their bond pads 54, 54A, 54B oriented in the same direction so that they are connected by bond wires 62 to metallization areas 58 on the same side of the device 50. However, semiconductor die orientation and other factors, such as semiconductor dice having different sizes and dimensions, may be changed to suit a particular application. Thus, major design factors affecting the stacked offset multiple semiconductor die device 50 include the number of semiconductor dice 60 in the stack 61, die dimensions, number of die edges 56 along which bond pads 54 are arrayed, offset direction(s), offset distance 82 and rotation angle of each semiconductor die 60 relative to the semiconductor die 60 just below.

Figure 15:
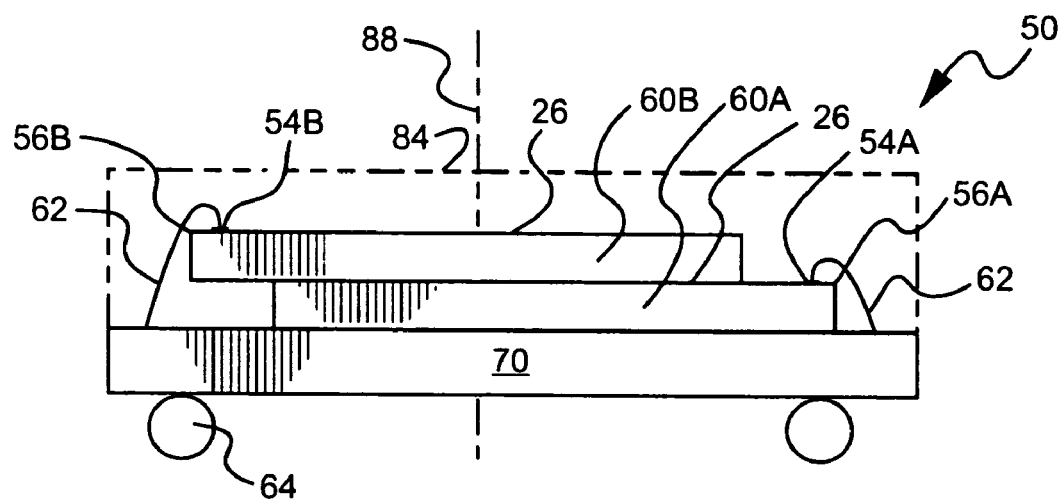
FIG. 15 is a side view of another embodiment of an offset stacked multiple die device in accordance with the invention.

As shown in drawing FIG. 15, semiconductor die 60B has been rotated 180 degrees about central Z-axis 88 such that its edge 56B along which bond pads 54B are positioned is opposite in direction to edge 56A of semiconductor die 60A. It is evident that semiconductor die 60B may alternatively be rotated zero degrees, 90 degrees, 180 degrees or 270 degrees relative to semiconductor die 60A. The conductive metallization area 58 on the substrate 70 must be configured for providing short bond wire connections with the bond pads 54A, 54B.

Figure 16:
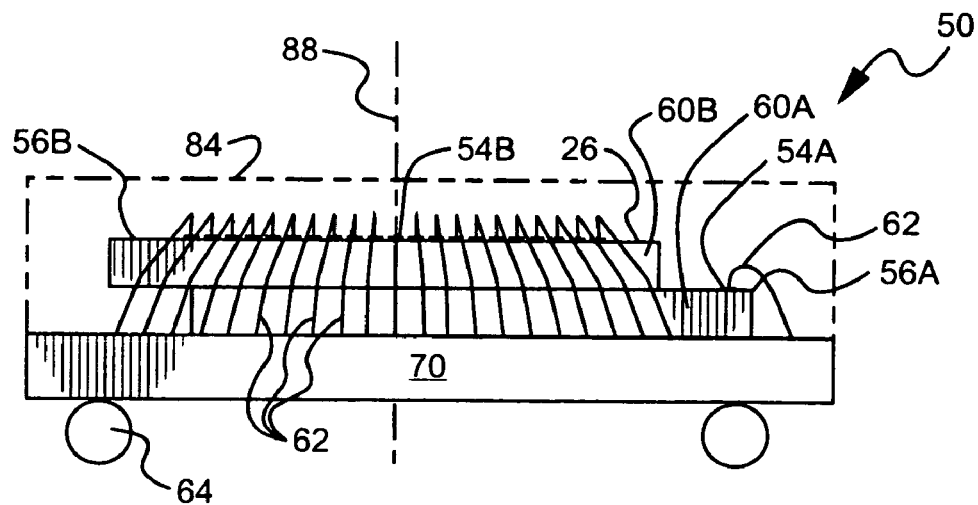
FIG. 16 is a side view of a further embodiment of an offset stacked multiple die device in accordance with the invention.

Depicted in drawing FIG. 16 is an offset stacked two-semiconductor die device 50 in which the upper semiconductor die 60B is rotated 90 degrees clockwise about Z-axis 88. Thus, the row(s) of bond pads 54B are rotated 90 degrees from the row(s) of bond pads 54A. In this embodiment, both semiconductor dice 60A, 60B are depicted as having active surfaces 26 that are substantially square but the device 50 may be formed of substantially nonsquare semiconductor dice.

As will be evident, a variety of offset stacking configurations is available when using semiconductor dice 60 with bond pads 54 along one edge 56. Depicted in drawing FIGS. 17 through 24 is a variety of such configurations; this application is not limited to these particular configurations, which serve as examples. Each of these figures relates to a stack 61 of four offset semiconductor dice 60A, 60B, 60C and 60D in which individual semiconductor die may be offset in a forward direction, i.e., to the right, or in a reverse direction, i.e., to the left. In addition, an individual semiconductor die 60 may be rotated 180 degrees so that the bond pad location is reversed relative to the underlying semiconductor die. Reversal of a semiconductor die 60 results in attachment of its bond pads 54 to substrate 70 in a different location.

For the sake of clarity, drawing FIGS. 17 through 24 do not show adhesive layers, encapsulating material or other details of the device 50. The number of semiconductor dice 60 comprising the stack 61 is limited only by design, construction and operational limitations such as materials strength, heat generation and dissipation, electric operability and the like. The design of the stack 61 must be coordinated with substrate design, i.e., to ensure accurate and rapid wire bonding and meet other design criteria.

Figure 17:
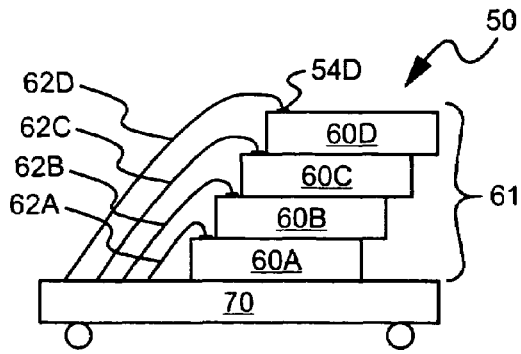

As shown in drawing FIG. 17, a plurality of semiconductor dice 60A, 60B, 60C and 60D may be consecutively stacked in a single offset direction, denoted herein as a "forward" direction. All of the semiconductor dice have bond pads 54 facing in the same direction. In this stacking configuration, the bond wires 62A, 62B, 62C or 62D of each semiconductor die is bonded to a substrate 70 at the same side of the stack 61.

Figure 18:
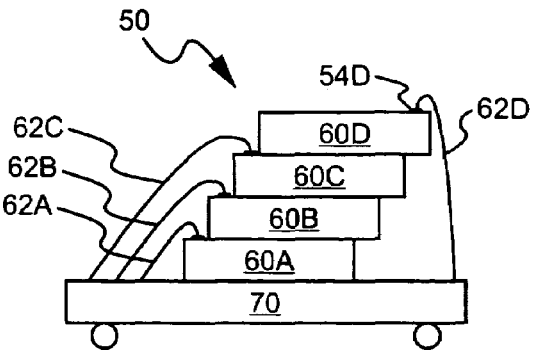

The embodiment of drawing FIG. 18 differs from drawing FIG. 17 in that the uppermost semiconductor die 60D is rotated 180 degrees relative to the other semiconductor dice 60A, 60B, 60C, and has bond pads 54D attached to the substrate 70 on the other side of the stack 61.

Illustrated in drawing FIGS. 19 through 24 are other offset multiple semiconductor die devices 50 in which semiconductor dice 60 are offset in both forward and reverse directions.

Figure 19:
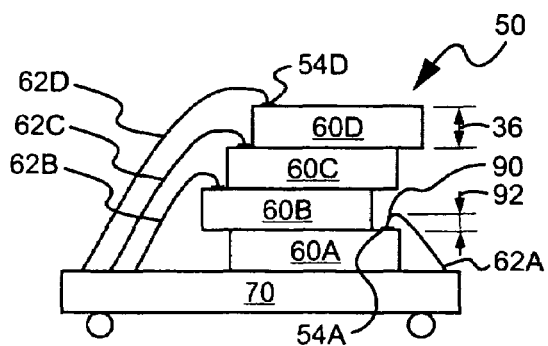
Figure 20:
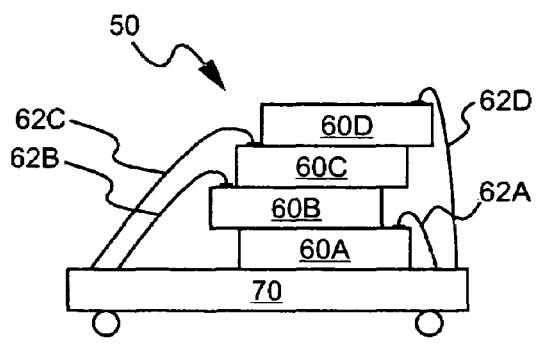

Illustrated in drawing FIGS. 19 and 20 are devices 50 that have a second semiconductor die 60B with a reverse offset and that is rotated 180 degrees relative to lowermost semiconductor die 60A. Semiconductor dice 60C and 60D are similarly rotated relative to semiconductor die 60A, and each is forwardly offset from its underlying die. In drawing FIG. 19, the bond wires 62 from the three upper semiconductor dice 60B, 60C and 60D are bonded to the substrate 70 on the same side of the stack 61, while semiconductor die 60A is bonded on the opposing side of the stack. In drawing FIG. 20, semiconductor die 60D is attached to the stack 61 in an unrotated position relative to semiconductor die 60A. Semiconductor die 60D has its bond wires 62D connected to substrate 70 in the vicinity of bond wires 62A, i.e., on the opposite side of the stack from bond wires 62B and 62C.

Figure 21:
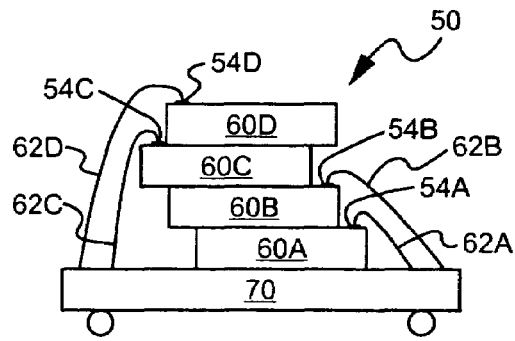
Figure 22:
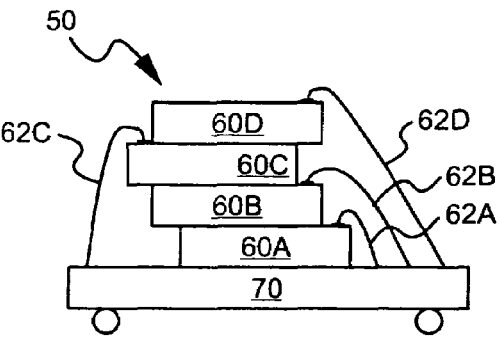

As illustrated in drawing FIGS. 21 and 22, semiconductor dice 60B and 60C are offset in a reverse direction from semiconductor die 60A, and semiconductor die 60D is offset in a positive direction from underlying semiconductor die 60C. Illustrated in drawing FIG. 21, semiconductor dice 60C and 60D are both rotated 180 degrees relative to semiconductor dice 60A and 60B, so that their bond pads 54C and 54D face in an opposite direction from bond pads 54A and 54B. Illustrated in drawing FIG. 22, semiconductor die 60D of the device 50 in drawing FIG. 21 has been rotated 180 degrees and its bond wires 62D attached to the substrate 70 in the vicinity of bond wires 62A and 62B.

Figure 23:
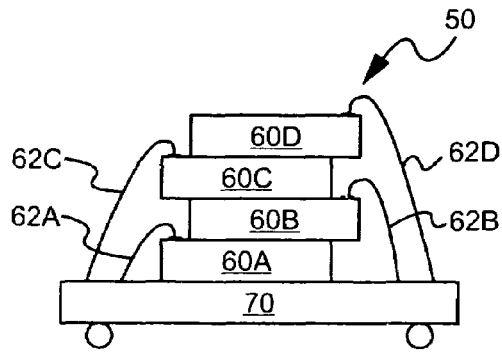

As shown in drawing FIG. 23, the semiconductor dice 60 in stack 61 may be ordered in an alternating fashion with respect to both die rotation, i.e., between a forward and reverse direction, and offset direction.

Figure 24:
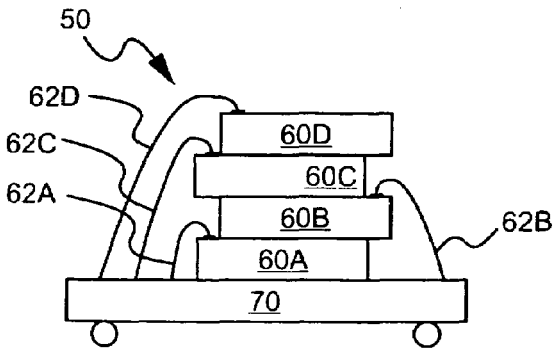

Alternatively, as shown in drawing FIG. 24, the uppermost semiconductor die 60D of a stack may have the same alternating offset pattern as the device 50 of drawing FIG. 23, but be rotated to have the same rotational orientation as its underlying semiconductor die 60C. The bond wires 62D will be joined to the substrate 70 in the vicinity of bond wires 62A and 62C.

Where the bond pads 54 of a semiconductor die 60 are overhung by a portion of another semiconductor die, those bond pads 54 may be wire-bonded to the substrate 70 prior to mounting the overhanging die in the stack 61. Using the configuration illustrated in drawing FIG. 19 as an example, it is seen that bond pads 54A are overhung by a portion of semiconductor die 60C. The height 92 of wire loop 90 is less than the die thickness 36, enabling wire bonding without subsequent contact of bond wires 62 with the overhanging semiconductor die 60C or intervening semiconductor die 60B or silicon spacer 60B.

Figure 25:
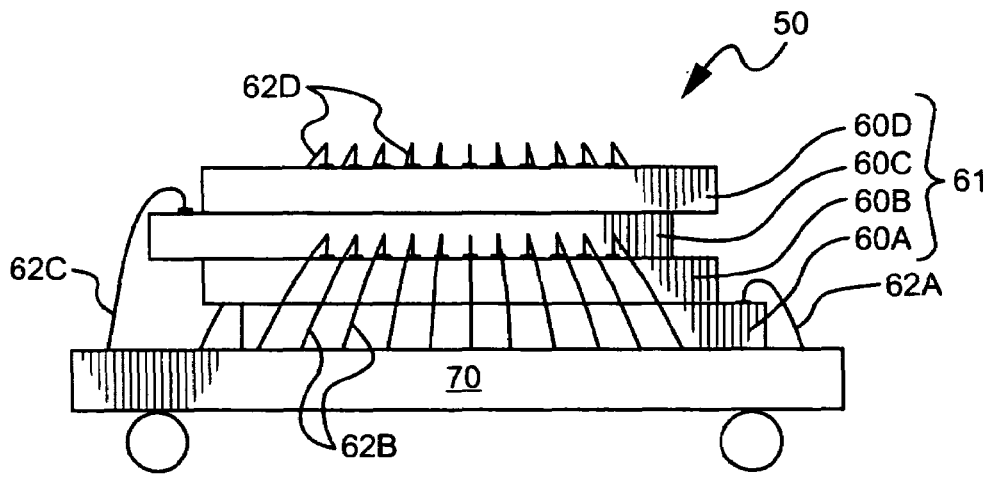
FIG. 25 is a side view of another embodiment of an offset stacked multiple die device having four dice that are sequentially rotated and offset in at least one direction.
Figure 26:
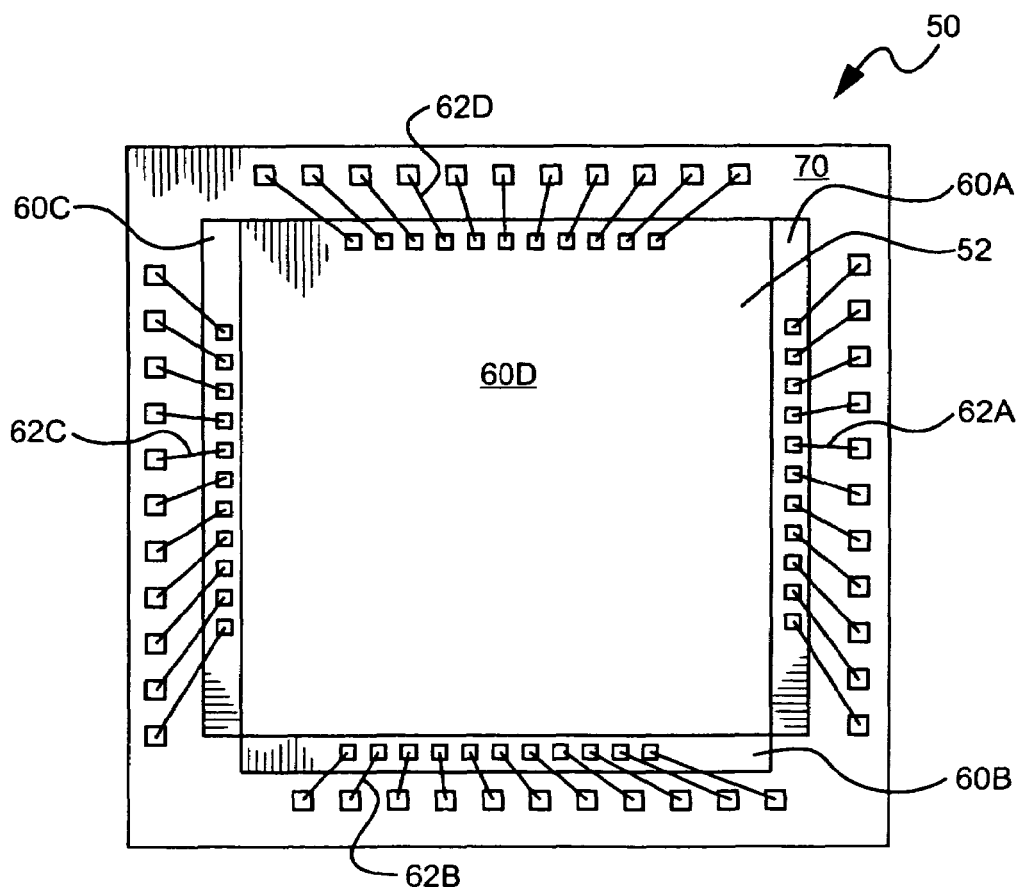
FIG. 26 is a plan view of an embodiment of an offset stacked multiple die device having four dice that are sequentially rotated and offset in at least one direction, in accordance with the invention.

Turning now to drawing FIGS. 25 and 26, another embodiment of an offset stacked device 50 is shown with a stack 61 of four semiconductor dice 60A, 60B, 60C and 60D. Each semiconductor die 60 has a square active surface 52 and all semiconductor dice 60 are constructed to be physically identical. By rotating each semiconductor die 60 to be 90 degrees from the next lower die, and offsetting each successive semiconductor die to avoid the bond pads 54 of the next lower semiconductor die, all bond pads 54 of the four semiconductor dice 60 are exposed for wire bonding in a single uninterrupted step.

The stacked offset multiple die device 50 of this invention may have any form of substrate 70 known in the art. For example, the substrate 70 may be a metalized lead frame as already shown in drawing FIG. 12A.

Figure 27:
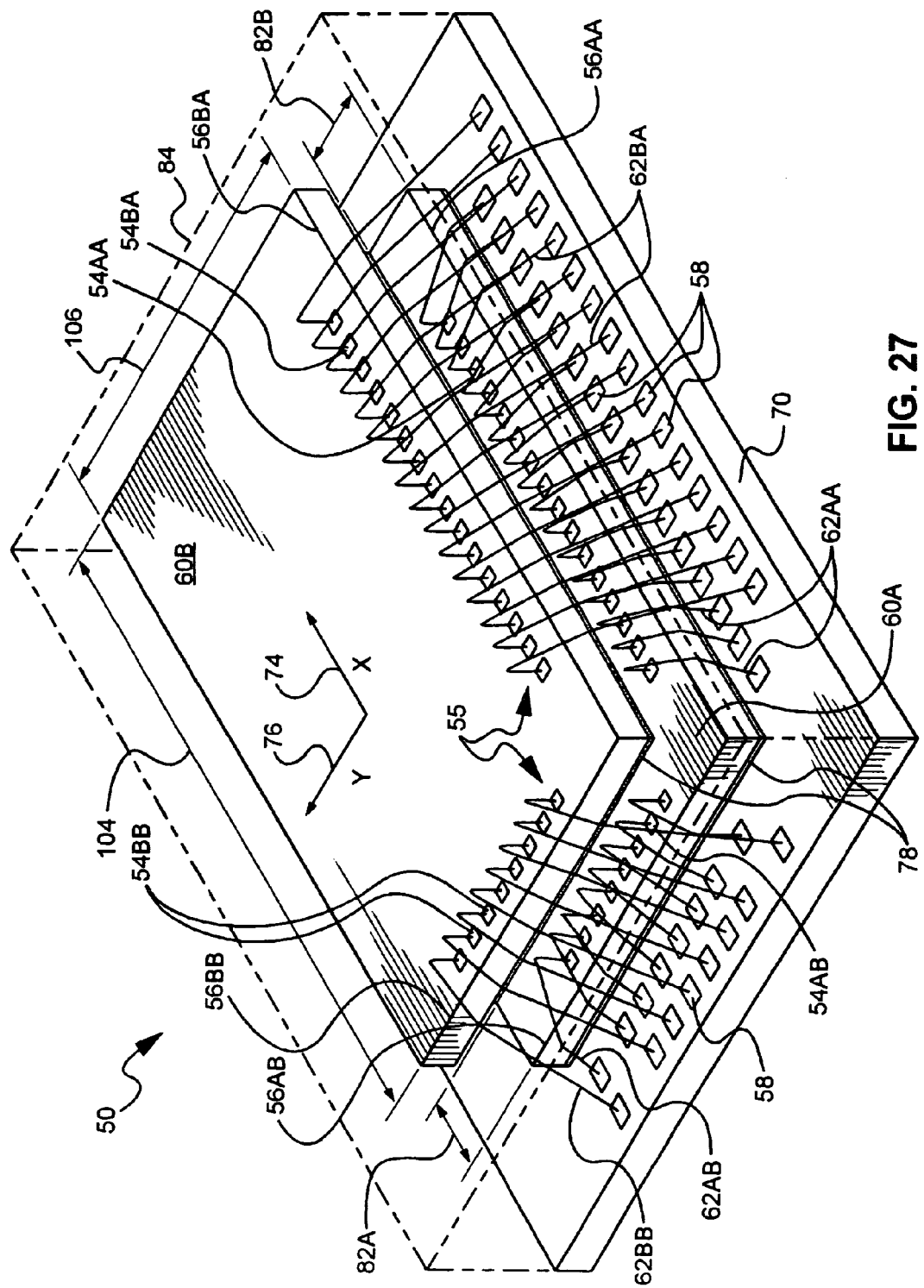
FIG. 27 is an isometric view of an offset stacked multiple die device formed of two dice with bond pads along two adjacent edges wherein an upper die is offset from an underlying die along both the X-axis and Y-axis in accordance with the invention.

Turning now to drawing FIG. 27, yet another embodiment of an offset stacked device 50 of the invention is shown that is formed of two or more semiconductor dice such as semiconductor dice 60A, 60B having conductive bond pads 54A and 54B, respectively. The two semiconductor dice 60A, 60B are joined together and to substrate 70 by thin adhesive layers 78. On each semiconductor die 60A and 60B, the bond pads 54A and 54B are shown as formed along two adjacent edges of the semiconductor die 60A and 60B. Thus, for example, semiconductor die 60A has bond pads 54AA formed along die edge 56AA, and bond pads 54AB formed along adjacent die edge 56AB. Likewise, semiconductor die 60B has bond pads 54BA formed along die edge 56BA. Semiconductor die 60B also has bond pads 54BB formed alone die edges 56BB. Bond wires 62AA, 62BA, 62AB, 62BB connect substrate 70 to semiconductor dice 60A, 60B.

As shown in drawing FIG. 27, semiconductor die 60B is offset in position in two directions. Thus, semiconductor die 60B is offset from semiconductor die 60A a distance 82A along the X-axis 74 and a distance 82B along the Y-axis 76, whereby all of the bond pads 54AA and 54AB of semiconductor die 60A are exposed for easy wire bonding.

Additional semiconductor dice 60 may be mounted atop semiconductor die 60B. These semiconductor dice may be mounted in the same sequence, using a substrate 70 configured with metallization on two sides only of the stack 61. Alternatively, subsequent semiconductor dice 60C, . . . may be mounted atop semiconductor die 60B having the same pattern of offset, i.e., along both the X-axis 74 and Y-axis 76, but rotated 180 degrees relative to semiconductor dice 60A and 60B. As a result, wire bonds will be made to the substrate 70 on four sides of stack 61.

Figure 28:
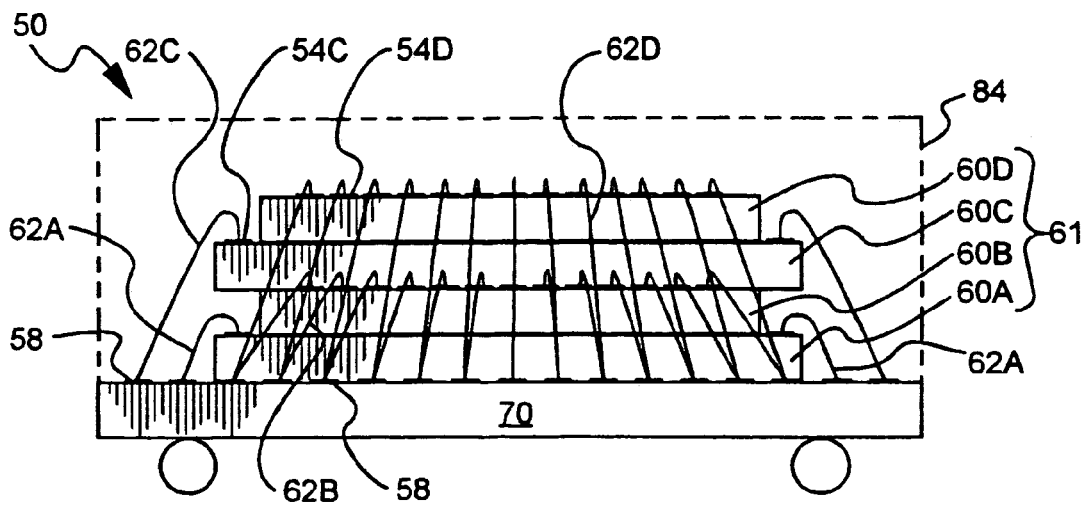
FIG. 28 is a side view of an offset stacked multiple die device formed of four elongated dice that have bond pads along two opposing edges wherein dice are arranged in an alternating sequence providing an offset from all dice, in accordance with the invention.
Figure 29:
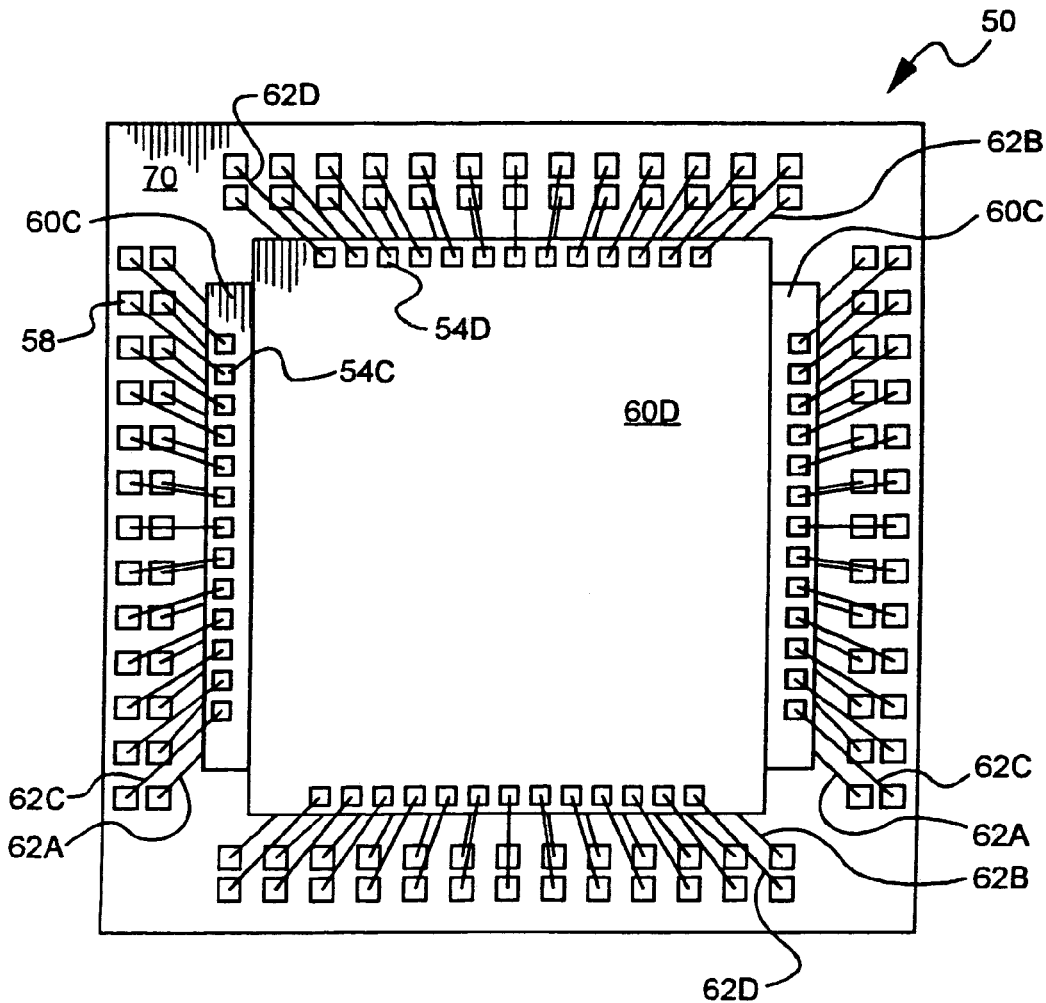
FIG. 29 is a plan view of an offset stacked multiple die device formed of four elongated dice that have bond pads along two opposing edges wherein dice are arranged in an alternating sequence providing an offset from all dice, in accordance with the invention.

A further embodiment of the invention is illustrated in drawing FIGS. 28 and 29, in which a semiconductor die stack 61 is formed of semiconductor dice 60 having bond pads 54 on each of two opposed edges 56 of the semiconductor die's active surface 52 (not shown). In this configuration, each added semiconductor die 60 is rotated 90 degrees or 270 degrees from the underlying semiconductor die to place the semiconductor die in an offset position. Each semiconductor die 60 has a length dimension 104 (see FIG. 27) that is longer than a width dimension 106 (see FIG. 27) by at least two times the required offset, i.e., to expose the bond pads 54 of the underlying semiconductor die. If desired, the semiconductor dice 60 can be of any convenient physical size and be of different physical size than the other. Use of more than two semiconductor dice 60 in the stack 61 results in semiconductor die bond pads 54 being overhung by a semiconductor die that is two positions higher in the stack. The manufacturing process will require intermediate wire bonding operations in this case. The stack configuration results in bond wires 62A and 62C to metallization areas 58 of the substrate 70 on two opposing sides of the stack 61, and bond wires 62B and 62D on the other two opposing sides of the stack. Thus, bond wires are located on all four sides of the stack 61.

As described herein, the invention provides a stacked multiple semiconductor die device or package of higher electronic density, in which individual die of similar size, different size, or the same size are offset from each other in the stack, enabling electrical attachment, e.g., wire bonding between the semiconductor dice and a substrate. Thus, the overall height of the stack of semiconductor dice, and the package formed therefrom, is minimal. Multiples of the stacked multiple die package may be combined in a large mass storage flash memory apparatus, for example.

The various embodiments of stacked offset multiple semiconductor die devices that are shown and described herein are exemplary and not limiting. It is understood that other configurations may include additional elements, for example, such elements including additional semiconductor dice and lead frames, heat sinks, dielectric layers, packaging, etc., as known in the art.

It is apparent to those skilled in the art that various changes and modifications may be made in the packaging methods and products of the invention as disclosed herein without departing from the spirit and scope of the invention as defined in the following claims.

What is claimed is:

1. A method of forming a memory device, the method comprising:

adhering a first die including a first set of bond pads along a front edge on a top surface of the first die to a substrate comprising conductive material;

adhering a second die, having the same dimensions as the first die and including a second set of bond pads along a front edge on a top surface of the second die, to the top surface of the first die with the front edge of the second die adjacent to the front edge of the first die and laterally offset from the first die to expose the first set of bond pads;

physically coupling a first bond wire between the first die and the substrate;

physically coupling a second bond wire between the second die and the first die;

physically coupling a third bond wire between the second die and the substrate; and encapsulating the first and second dice and the first, second, and third bond wires with an encapsulating material.

2. The method of claim 1, wherein adhering the first die and adhering the second die comprises providing the first die and the second die having the first set of bond pads and the second set of bond pads arranged identically.

3. The method of claim 2, wherein adhering the first die and adhering the second die comprises providing the first die and the second die having bond pads along no more than the respective front edges of the first and second die.

4. The method of claim 3, further comprising:
disposing a third die including bond pads along two adjacent edges thereof above the second die; and
physically coupling a fourth bond wire between the third die and the substrate; and
wherein encapsulating the first and second dice further comprises encapsulating the third die and the fourth bond wire with the encapsulating material.

5. The method of claim 4, further comprising locating the first, second, and third bond wires on a first side of the device, and locating the fourth bond wire on a second side of the device adjacent to the first side.

6. The method of claim 5, further comprising physically coupling bond wires only between the third die and the substrate of the device.

7. The method of claim 1, further comprising:
adhering a third die, including a third set of bond pads along a front edge on a top surface thereof and having the same dimensions as the second die, to the top surface of the second die with the front edge of the third die oriented adjacent to the front edge of the second die and laterally offset from the second die in the same direction the second die is laterally offset from the first die to expose the second set of bond pads;
physically coupling a fourth bond wire between the third die and the second die; and
physically coupling a fifth bond wire between the third die and the substrate; and
wherein encapsulating the first and second dice further comprises encapsulating the third die with the encapsulating material.

8. The method of claim 7, further comprising:
disposing a fourth die having dimensions different from the third die and including a fourth set of bond pads oriented in a different direction than the first, second, and third sets of bond pads, above the third die; and
physically coupling a sixth bond wire between the fourth die and the substrate; and
wherein encapsulating the first and second dice further comprises encapsulating the fourth die with the encapsulating material.

9. The method of claim 8, wherein adhering the first, second, and third dice comprises providing the first, second, and third dice having bond pads along no more than the respective front edges of the first, second, and third dice.

10. The method of claim 9, wherein disposing the fourth die comprises providing the fourth die having bond pads along two adjacent edges of the fourth die.

11. The method of claim 1, further comprising:
disposing a spacer above the second die;
disposing a third die above the second die, wherein the third die has the same dimensions as the second die, includes a third set of bond pads along a front edge on a top surface of the third die, and the third die is laterally offset from the second die in an opposite direction from which the second die is laterally offset from the first die, such that the front edge of the third die overhangs the front edge of the second die; and
physically coupling a fourth bond wire between the third die and the substrate; and
wherein encapsulating the first and second dice comprises encapsulating the third die with the encapsulating material.

12. The method of claim 11, wherein adhering the first and second die and disposing the third die comprise providing the first, second, and third dice having bond pads along no more than the respective front edges of the first, second, and third dice.

13. The method of claim 1, further comprising providing the substrate comprising a lead frame.

14. The method of claim 1, further comprising forming a substantially equiangular encapsulating enclosure with the encapsulating material.

15. The method of claim 1, further comprising providing the substrate comprising a printed circuit board, and configuring the memory device to provide for external electrical coupling using electrical connections other than solder balls.

16. The method of claim 15, further comprising locating bond wires on only two adjacent sides of the device.

17. A method of packaging a semiconductor device, the method comprising:
joining a first die including a first set of bond pads to a substrate comprising metallization using an adhesive;
joining a second die, having the same dimensions as the first die and including a second set of bond pads to the first die by an adhesive and offset from the first die in a forward direction;
disposing a third die, having the same dimensions as the first die, including a third set of bond pads, above the second die;
joining a fourth die, having the same dimensions as the first die and including a fourth set of bond pads to the third die by an adhesive and offset from the third die in a forward direction;
wherein the first, second, third, and fourth sets of bond pads face the same direction;
joining at least one bond pad of the first set of bond pads, at least one bond pad of the second set of bond pads, at least one bond pad of the third set of bond pads, and at least one bond pad of the fourth set of bond pads to the metallization of the substrate with a first plurality of bond wires;
joining at least one bond pad of the second set of bond pads to at least one bond pad of the first set of bond pads and at least one bond pad of the fourth set of bond pads to at least one bond pad of the third set of bond pads with a second plurality of bond wires; and
enclosing the first, second, third, and fourth dice and the first and second plurality of bond wires with an encapsulant.

18. The method of claim 17, further comprising providing each of the first, second, third, and fourth dice, the first, second, third, and fourth dice including bond pads along no more than a single respective edge of each of the first, second, third, and fourth dice.

19. The method of claim 18, further comprising:
disposing a fifth die including a fifth set of bond pads facing a different direction than the first, second, third, and fourth sets of bond pads above the fourth die;
joining the fifth set of bond pads to the metallization of the substrate with a third plurality of bond wires; and
enclosing the fifth die and the third plurality of bond wires with the encapsulant.

20. The method of claim 19, further comprising locating the first and second pluralities of bond wires on a first side of the device, and the third plurality of bond wires on a second side of the device adjacent to the first side.

21. The method of claim 20, further comprising joining the fifth die only to the substrate with bond wires.

22. The method of claim 21, further comprising providing the fifth die, wherein the fifth die has different dimensions than the first die.

23. The method of claim 21, further comprising providing the fifth die, wherein the fifth die has different dimensions than the first die and includes bond pads along only two adjacent edges of the fifth die.

24. The method of claim 22, further comprising providing the substrate as a flash memory card substrate, and configuring the memory device to provide for external electrical coupling using electrical connections other than solder balls.

25. The method of claim 24, further comprising locating bond wires on only two adjacent sides of the device.

26. The method of claim 17, further comprising:
disposing a fifth die including a fifth set of bond pads above the fourth die; and
joining the fifth set of bond pads to the metallization of the substrate using a third plurality of bond wires, and leaving the fifth die unjoined to any other die in the device by any bond wires.

27. The method of claim 26, wherein disposing the fifth die comprises providing the fifth die having different dimensions than the first die.

28. The method of claim 26, further comprising providing the first, second, third, and fourth dice, the first second, third, and fourth dice having the same bond pad configuration, and providing the fifth die, the fifth die having a different bond pad configuration.

29. The method of claim 28, further comprising interposing a spacer material between at least two of the first, second, third, and fourth dice, and offsetting the third die from the second die in a reverse direction.

30. The method of claim 28, further comprising providing each of the first, second, third, and fourth dice including bond pads along no more than a single respective edge of each of the first, second, third, and fourth dice.

31. The method of claim 30, further comprising providing the substrate as a flash memory card substrate, and configuring the semiconductor device to provide for external electrical coupling using electrical connections other than solder balls, and to have bond wires on only two adjacent sides of the semiconductor device.

32. The method of claim 17, further comprising interposing a spacer material between at least two of the first, second, third, and fourth dice, and offsetting the third die from the second die in a reverse direction.

33. The method of claim 32, further comprising providing each of the first, second, third, and fourth dice including bond pads along no more than a single respective edge of each of the first, second, third, and fourth dice.

34. The method of claim 33, further comprising providing the substrate in the form of a lead frame.

35. The method of claim 17, further comprising providing the substrate in the form of a lead frame.

36. The method of claim 17, further comprising forming a substantially equiangular enclosure with the encapsulant.

37. The method of claim 17, further comprising providing the substrate as a flash memory card substrate, and configuring the semiconductor device to provide for external electrical coupling using electrical connections other than solder balls.

38. The method of claim 37, further comprising locating bond wires only on two adjacent sides of the semiconductor device.

39. A method of forming a device, the method comprising:
disposing a first die including a first set of bond pads above a package substrate;
attaching a second die to the first die, offset from the first die in a forward direction to expose the first set of bond pads, the second die having the same dimensions and bond pad layout as the first die and including a second set of bond pads oriented in the same direction as the first set of bond pads;
disposing a third die, having different dimensions and different bond pad layout than the first die and including a third set of bond pads, above the package substrate;
bonding a first bond wire between a bond pad of the first set of bond pads and the substrate;
bonding a second bond wire between a bond pad of the second set of bond pads and the substrate;
bonding a third bond wire between a bond pad of the third set of bond pads and the substrate;
bonding a fourth bond wire between a bond pad of the first set and a bond pad of the second set; and
encapsulating the first, second, and third dice with a material.

40. The method of claim 39, further comprising bonding no bond wires between the third die and any other die in the device.

41. The method of claim 40, further comprising bonding bond wires to no more than one respective edge of each of the first and the second dice.

42. The method of claim 41, further comprising bonding the first and second bond wires to the substrate on a first side of the device, and bonding the third bond wire to the substrate on a second side of the device different from the first side.

43. The method of claim 42, further comprising providing the package substrate as a flash memory card substrate, and providing external electrical coupling for the device using electrical connections other than solder balls.

44. The method of claim 43, further comprising selecting the second side of the device to be adjacent to the first side of the device.

45. The method of claim 44, further comprising disposing the third die above the second die.

46. The method of claim 39, further comprising bonding the first and second bond wires to the substrate on a first side of the device, and bonding the third bond wire to the substrate on a second side of the device adjacent to the first side.

47. The method of claim 46, further comprising disposing the third die above the second die.

48. The method of claim 47, further comprising providing the package substrate as a flash memory card substrate, and providing the device with external electrical coupling using electrical connections other than solder balls.

49. The method of claim 39, further comprising attaching the second die to the first die absent an intervening spacer layer between the first die and the second die.

50. The method of claim 49, further comprising interposing a spacer material between at least two adjacent dice of the device and offsetting at least one die of the device, having the same dimensions and bond pad layout as the first die, in a reverse direction from a lower die.

51. The method of claim 39, further comprising providing the substrate in the form of a lead frame.

52. The method of claim 51, further comprising forming a substantially equiangular package structure with the material.

53. The method of claim 39, further comprising providing the package substrate as a flash memory card substrate, and providing for external electrical coupling of the device using electrical connections other than solder balls.

54. The method of claim 53, further comprising locating bond wires on only two adjacent sides of the device.

* * * * *

UNITED STATES PATENT AND TRADEMARK OFFICE
CERTIFICATE OF CORRECTION

PATENT NO. : 7,704,794 B2 Page 1 of 1
APPLICATION NO. : 11/599223
DATED : April 27, 2010
INVENTOR(S) : Leonard E. Mess et al.

It is certified that error appears in the above-identified patent and that said Letters Patent is hereby corrected as shown below:

On the Title Pg Item (57), under "Abstract", line 9, delete "maximum" and insert -- high --, therefor.

Signed and Sealed this

Fifteenth Day of June, 2010

David J. Kappos
*Director of the United States Patent and Trademark Office*